United States Patent
Liu

(10) Patent No.: US 8,210,698 B2
(45) Date of Patent: Jul. 3, 2012

(54) PHOSPHOR LAYER HAVING ENHANCED THERMAL CONDUCTION AND LIGHT SOURCES UTILIZING THE PHOSPHOR LAYER

(75) Inventor: Heng Liu, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/845,104

(22) Filed: Jul. 28, 2010

(65) Prior Publication Data

US 2011/0069490 A1   Mar. 24, 2011

(51) Int. Cl.
*F21V 9/16* (2006.01)
(52) U.S. Cl. ............. 362/84; 313/485; 362/217.08
(58) Field of Classification Search .......... 362/84, 362/34, 217.08, 260; 313/485–487; 257/98, 257/100
See application file for complete search history.

(56) References Cited

U.S. PATENT DOCUMENTS

| | | | |
|---|---|---|---|
| 7,319,289 B2 * | 1/2008 | Suehiro et al. ........... 313/485 |
| 7,518,160 B2 * | 4/2009 | Fukudome et al. ......... 257/98 |
| 7,938,550 B2 * | 5/2011 | Takenaka ................. 362/84 |
| 2004/0145895 A1 * | 7/2004 | Ouderkirk et al. ......... 362/260 |
| 2005/0135079 A1 * | 6/2005 | Chua et al. ............... 362/12 |
| 2005/0231953 A1 * | 10/2005 | Reeh et al. ............... 362/260 |
| 2005/0236628 A1 | 10/2005 | Matsura |
| 2009/0116216 A1 * | 5/2009 | Kim et al. ................ 362/84 |
| 2009/0256166 A1 | 10/2009 | Koike |
| 2009/0262516 A1 * | 10/2009 | Li ......................... 362/84 |

FOREIGN PATENT DOCUMENTS

KR   10-2006-0102676 A   9/2006

OTHER PUBLICATIONS

International Search Report, PCT/US2011/039155, Jan. 18, 2012.

* cited by examiner

*Primary Examiner* — Bao Q Truong
(74) *Attorney, Agent, or Firm* — Calvin B. Ward

(57) ABSTRACT

A light-conversion composition and light sources utilizing that composition are disclosed. The light-conversion composition includes a transparent carrier medium, a phosphor-conversion medium, and a heat-conducting medium. The transparent carrier medium is transparent to light at first and second wavelengths. The phosphor-conversion medium converts light of the first wavelength to light of the second wavelength, the phosphor-conversion medium being dispersed in the transparent carrier medium. The heat-conducting medium has a thermal resistance that is less than that of the carrier medium. The heat-conducting medium is dispersed in the transparent carrier medium such that the heat-conducting medium is present in a concentration sufficient to yield a net thermal resistance that is less than 90 percent of the carrier thermal resistance. The heat-conducting medium can include particles of a transparent crystalline material, such as silicon, diamond, or sapphire.

13 Claims, 3 Drawing Sheets

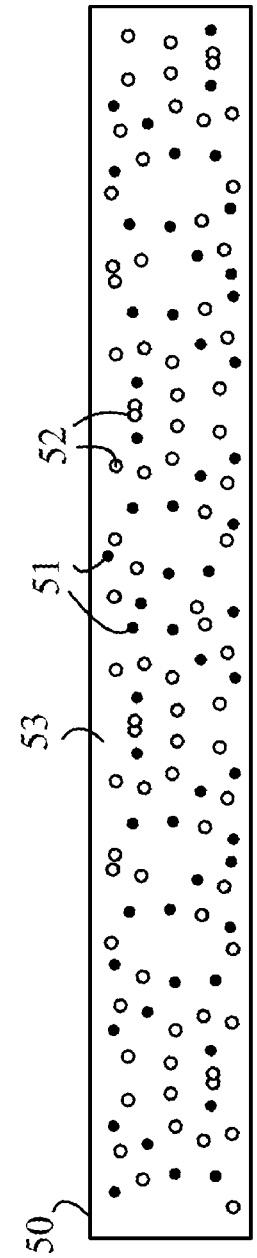

PHOSPHOR LAYER HAVING ENHANCED THERMAL CONDUCTION AND LIGHT SOURCES UTILIZING THE PHOSPHOR LAYER

BACKGROUND OF THE INVENTION

Light-emitting diodes (LEDs) are good candidates to replace incandescent and other light sources. LEDs have higher power-to-light conversion efficiencies than incandescent lamps and longer lifetimes. In addition, LEDs operate at relatively low voltages, and hence, are better adapted for use in many battery-powered devices. Furthermore, LEDs are point sources, and hence, are better adapted than fluorescent sources for lighting systems in which a point light source that is collimated or focused by an optical system is required.

To compete with incandescent lights, the output spectrum of the LED must be altered to provide a spectrum that is perceived as being "white" by a human observer. In general, LEDs generate light in a small band of wavelengths. Hence, to build a light source that is perceived as being white, either the light from a number of LEDs of differing output wavelengths must be combined or light from a monochromatic LED must be down converted by a phosphor layer to provide light in additional regions of the visual spectrum. The most common form of white LED utilizes a blue-emitting LED and a layer of phosphor that converts part of the blue light into yellow light. The combination of blue and yellow light is perceived by a human observer to be white if the ratio of blue to yellow light is properly chosen.

Heat dissipation is a significant problem in LED-based lighting systems that are to compete with incandescent and fluorescent light sources. Unlike incandescent lights, LEDs must be run at relatively low temperatures. First, the efficiency with which an LED coverts electrical power to light decreases as the temperature of the LED increases. Second, the phosphor-conversion layers are typically constructed by dispersing phosphor particles in an epoxy layer that overlies the LED. When the blue light is converted to yellow light by the phosphor particles, the difference in energy between the blue photons and the yellow photons becomes heat that is deposited in the phosphor particle. This heat must pass through the phosphor layer before being dissipated to the ambient environment. Since the base material in which the phosphor is suspended has poor thermal conductivity, the temperature of the phosphor particles must be significantly above ambient to drive the heat through this layer. This heating often leads to structural failure in the phosphor layer due to the difference in thermal expansion coefficient between the carrier material and the phosphor particles. It should be noted that the fraction of the blue light that is converted to heat is significant. Hence, as the power output of the light sources increases, the problems associated with phosphor layer degradation also increases.

SUMMARY OF THE INVENTION

The present invention includes a light-conversion composition and light sources that utilize that composition. The light-conversion composition includes a transparent carrier medium, a phosphor-conversion medium, and a heat-conducting medium. The transparent carrier medium is transparent to light at first and second wavelengths and is characterized by carrier thermal resistance. The phosphor-conversion medium converts light of the first wavelength to light of the second wavelength, the phosphor-conversion medium being dispersed in the transparent carrier medium. The heat-conducting medium has a thermal resistance that is less than the carrier thermal resistance. The heat-conducting medium is dispersed in the transparent carrier medium. The light-conversion composition is characterized by a net thermal resistance, and the heat-conducting medium is present in a concentration sufficient to yield a net thermal resistance that is less than 90 percent of the carrier thermal resistance. In one aspect of the invention, the heat-conduction medium includes particles of a transparent crystalline material such as silicon, diamond, or sapphire. In another aspect of the invention, the heat-conduction medium includes reflective particles of a metal.

A light-emitting device according to the present invention includes a light-emitting element that emits light at a first wavelength and a light-conversion structure having the light conversion composition discussed above. In one aspect of the invention, the light-conversion structure is separated from the light-emitting element by a thermally insulating medium.

BRIEF DESCRIPTION OF THE DRAWINGS

FIG. 3 illustrates the problems involved in removing heat from the phosphor layer.

FIG. 4 is cross-sectional view of a phosphor-conversion layer according to one embodiment of the present invention.

DETAILED DESCRIPTION OF THE PREFERRED EMBODIMENTS OF THE INVENTION

Figure 1:
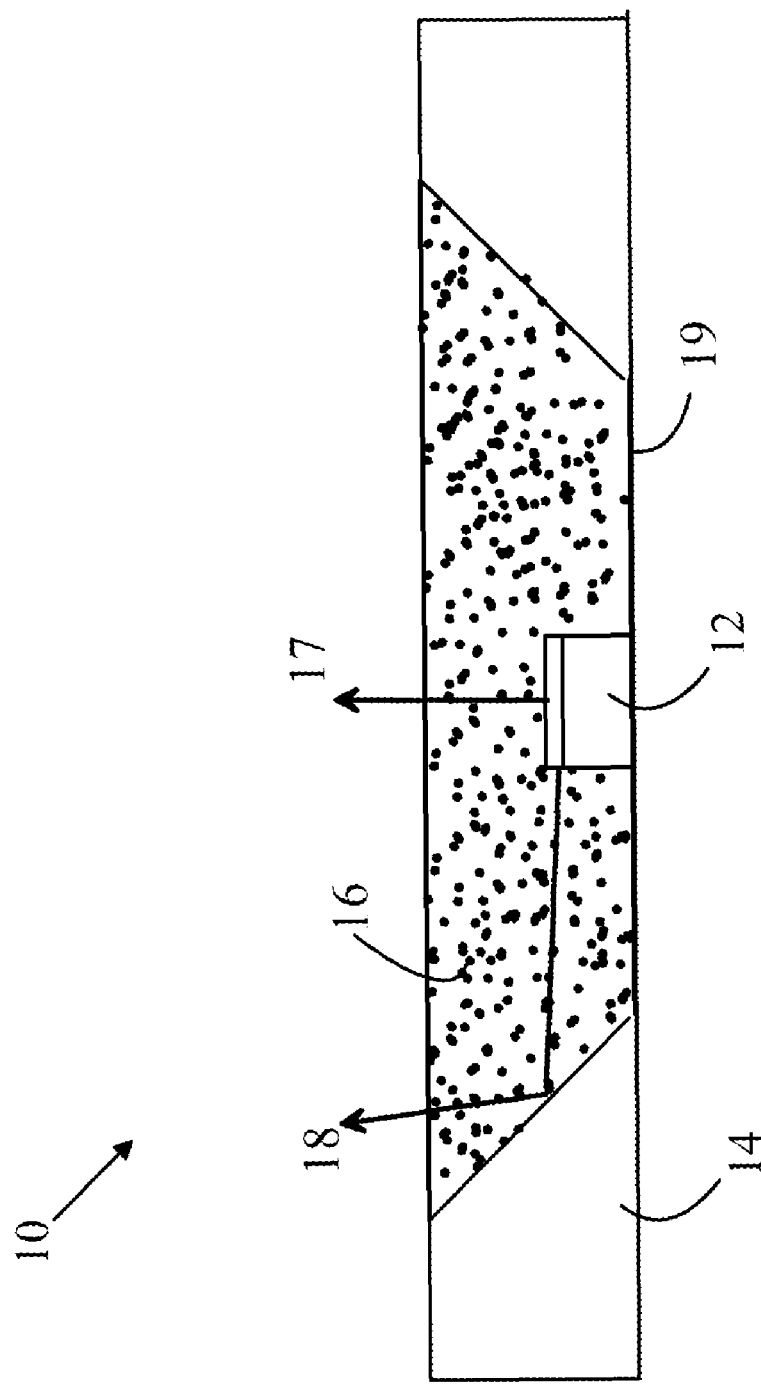
FIG. 1 is a cross-sectional view of a typical prior art arrangement for a phosphor-converted LED source of a type that is currently in general use.

The manner in which the present invention provides its advantages can be more easily understood with reference to FIG. 1. FIG. 1 is a cross-sectional view of a typical prior art arrangement for a phosphor converted LED source 10 of a type that is currently in general use. A light-emitting semiconductor die 12 is mounted within a cavity on a substrate 14. The LED includes an active layer that generates light when holes and electrons recombine in the active layer. Light from the active region that does not strike the top surface of the LED at an angle less than the critical angle, is trapped within the LED and exits the LED from the sides of the LED. The trapped light is concentrated in a horizontal layer that is defined by the top surface of the LED and a layer within the LED structure that has an index of refraction that is greater than that of the underlying layers of the LED. In some LED structures the bottom boundary is the substrate on which the LED layers are fabricated. In other LEDs, the bottom layer is a layer between the active region and the substrate. The LED is positioned in a reflecting cup such that light that leaves the LED through the side surfaces is reflected upwards and exits through the top surface of light source 10 as shown at 18. This reflected light exits at an angle similar to the light that leaves the top surface of the LED as shown at 17.

As noted above, part of the light from the die is converted by a phosphor to light of another color such that the combination of the converted and unconverted light is perceived to be the desired color. The phosphor layer is typically fabricated by mixing particles of a phosphor material into a transparent carrier, typically an epoxy or silicone based compound. The resulting material 16 is applied over the die in the cavity to partially or entirely fill that cavity. Heat and/or UV light is then applied to cure the carrier, and hence, provide a semi-transparent phosphor layer.

Phosphor layer 16 is subjected to heating from two sources in LED 10. First, the LED itself generates a significant amount of heat. Part of this heat is dissipated through surface 19, which typically includes a layer of thermally-conducting material that is connected to some form of heat-dissipating structure. To simplify the drawing, the heat-dissipating structures have been omitted from the drawing. Second, as noted above, the phosphor particles generate a significant amount of heat. As a result of the heat generation, the phosphor layer often fails structurally, which results in the LED failing. Accordingly, a better method of removing heat from the phosphor layer and/or reducing the heat that is transferred to the phosphor layer is needed.

Figure 2:
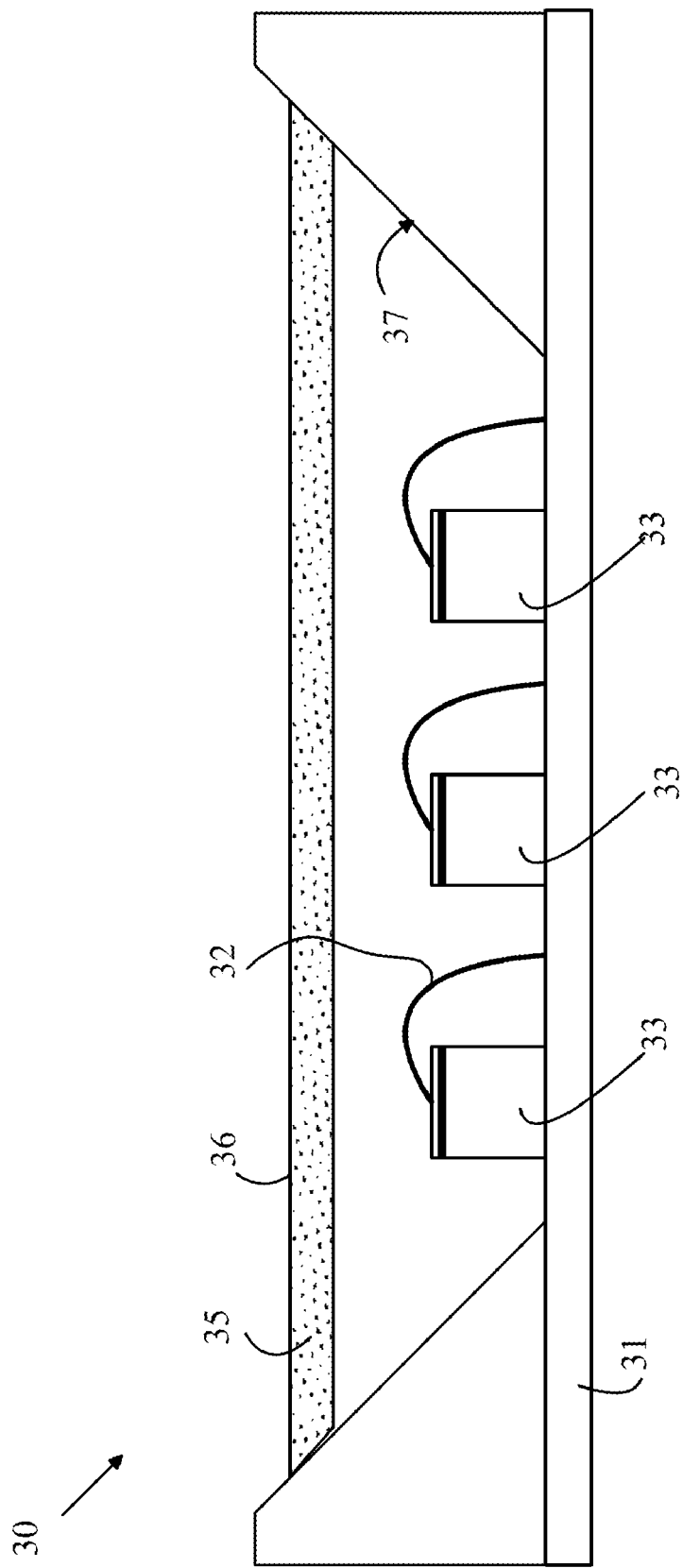
FIG. 2 is a cross-sectional view of an LED light source that utilizes one method for reducing the heat that must be dissipated from the phosphor layer.

One method for reducing the heat that must be dissipated from the phosphor layer places the phosphor layer at a location remote from the LED so that the only heat that must be dissipated through the phosphor layer is the heat generated in the phosphor layer. Refer now to FIG. 2, which is a cross-sectional view of an LED light source that utilizes this approach. Light source 30 is constructed on a substrate 31 on which a plurality of dies 33 having LEDs thereon are mounted. Substrate 31 includes a plurality of traces that are used to power the various LEDs. It is assumed that the dies have one power contact on the bottom surface of each die and one contact on the top surface of each die. The bottom contact is bonded to a corresponding connection pad on substrate 31. The top contact is connected to a corresponding trace on substrate 31 by a wire bond such as wire bond 32. To simplify the drawings, the various traces and connection pads have been omitted from the drawings. The LEDs are mounted in a cup 37 that has reflective sides to redirect light striking the sides of cup 37 to the forward direction.

Part of the light from the LEDs is converted by a layer 36 of phosphor particles. Layer 36 is constructed on a clear layer in which phosphor particles 35 are suspended. Layer 36 can be separately molded and placed over the LEDs leaving an air space between the dies and layer 36, and hence, heat generated in the dies is not directly coupled to layer 36. This reduces the amount of heat that must be dissipated by moving through layer 36. However, there is still the problem of the heat generated in the phosphor particles that must be transferred to the ambient environment through the carrier material.

Refer now to FIG. 3, which illustrates the problems involved in removing heat from the phosphor layer. Consider a particle 41 in phosphor layer 40. When a blue photon having a wavelength of 475 nm is converted to a yellow photon having a wavelength of 570 nm, the difference in energy is converted to heat in the phosphor particle. Hence, 95/475 or 20 percent of the energy in the blue photon is converted to heat. If half of the blue light is converted in the phosphor layer, 10 percent of the power in the output light from the LED ends up as heat in the phosphor particles, which must then be transferred through carrier material by conduction to the ambient environment. When a photon 42 is converted, the temperature of the phosphor particles increases by an amount that depends on the size of the particle. The temperature of the particle then decreases over time as the heat that was initially stored in the phosphor particle is transferred through the carrier material to the outside environment as shown at 44. If another photon is converted before the heat from the last conversion is dissipated, the temperature of the particle is increased accordingly. Since the amount of heat that is transferred between the particle and the environment is proportional to the temperature difference between the particle and the environment, the particle finally reaches a temperature at which sufficient heat is transferred between conversion events to maintain the particle at a constant temperature.

In general, the thermal coefficient of expansion for the phosphor material is different from that of the carrier material in which the particles are dispersed. If the equilibrium temperature is sufficiently high, the particle will either expand relative to the carrier material and cause a crack in the phosphor layer, or contract and pull away from the carrier material leaving a void that will scatter light, and hence, reduce the light that actually reaches the phosphor particle. In the later case, the color of the light source will be shifted. Eventually, the voids or cracks will cause a structural failure in the phosphor layer, and the light source will fail.

As the amount of light that must be converted per unit time increases, the equilibrium temperature also increases. Hence, as ever-higher wattage light sources are constructed to meet the needs of the commercial lighting market, the problems of phosphor layer failure increase.

To reduce these problems, the rate at which heat is dissipated by the particles must be increased. The amount of heat that is dissipated by a particle is proportional to the thermal conductivity of the medium in which the particles are suspended and the thickness of the phosphor layer. Hence, to improve the heat transfer, and hence, reduce the equilibrium temperature, either the thickness of the phosphor layer must be reduced or the thermal conductivity of the phosphor layer must be increased. As noted above, the materials that are typically used for the carrier material have very poor thermal conductivities. These materials are typically epoxy or silicone materials.

The present invention is based on the observation that there are solid materials that have significantly higher thermal conductivity than the carrier materials that can be added to the phosphor layer to increase the mean thermal conductivity of the layer without substantially interfering with the transmission and conversion of the blue light in the phosphor layer. Refer now to FIG. 4, which is cross-sectional view of a phosphor-conversion layer 50 according to one embodiment of the present invention. Conversion layer 50 is constructed by suspending two types of particles in a layer of a transparent carrier material 53. The first type of particles is the phosphor particles discussed above and shown at 51. The second type of particle is a thermal enhancement particle such as shown at 52. Thermal enhancement particles 52 are particles of a material that have a higher thermal conductivity than carrier material 53, and hence, reduce the average thermal conductivity of phosphor layer 50. The thermal enhancement particles must be constructed from a material that does not significantly absorb light from the light source that illuminates phosphor layer 50.

In one embodiment, the thermal enhancement particles are constructed from a transparent crystalline material that has a high thermal conductivity. For example, particles 52 can be diamond particles, silicon particles, or sapphire particles. Diamond particles are routinely used in polishing systems. In addition, diamond particles and coatings are routinely generated by low vapor deposition techniques. The coatings have been utilized to render various soft materials such as plastics scratch resistant. Silicon particles can be generated by grinding conventional silicon or sapphire wafers of the type used in integrated circuit fabrication.

Since the materials are transparent to light in the visible spectrum, the presence of such particles does not significantly reduce the light output from the light source. In fact, the particles can be used as a replacement for the diffusant particles that are often added to phosphor layers to diffuse the unconverted blue light so that the blue light is emitted in the same omnidirectional manner as the phosphor generated light. In prior art phosphor layers, the diffusing particles are typically glass, which has a very low thermal conductivity. Hence, the present invention provides both the diffusion function and improved thermal conductivity.

The above-described embodiments utilize transparent thermal conducting particles. However, it should be noted that an opaque reflective particle could likewise be utilized. The purpose of the diffusants is to scatter light from the LEDs in all directions, so that the diffusant particles appear to be omnidirectional blue emitters and yellow emitters; the phosphor particles appear to be omnidirectional yellow emitters. Hence, the light source appears to be an omnidirectional source originating in the conversion layer rather than a point blue source and an extended yellow source. Reflective metal particles reflect light in all directions, and hence, can provide the diffusing function. Since the metal particles reflect the light rather than absorb the light, the efficiency of the light source is not significantly decreased. The thermal conductivity of metal, however, is much greater than that of diamond or silicon, and hence, the average thermal conductivity of the phosphor layer is significantly improved relative to the clear crystalline materials discussed above.

If the particles are to serve the dual roles of heat transfer enhancement and diffusant, then the size of the particles should be greater than, or on the order of, the wavelength of light that is to be scattered. If only improvement in thermal conductivity is needed, then the particle size can be chosen to be significantly less than the wavelength of light. In this case, the particles will not significantly alter the light paths.

The thermal conductivity of the compound medium as seen by any given phosphor particle is determined by the average thermal resistance between that phosphor particle and the boundaries of the phosphor layer. If, for example, 10 percent of the volume of the conventional carrier were replaced by particles that have a thermal resistance that is small compared to that of the carrier material, the thermal resistivity of the phosphor layer would be decreased by approximately 10 percent. If the particles are transparent and of a size that scatters light, the particle density can be set such that the combined scattering of the particles by the transparent particles and the phosphor particles results in the blue light that is not converted by the phosphor particles being scattered with the same probability that the phosphor particles convert blue photons to yellow photons. In this case, the blue light will appear to originate from the phosphor layer itself, rather than the underlying LED.

In one aspect of the present invention, the concentration of the thermally-conducting medium is sufficient to reduce the net thermal resistance of the combination of the transparent carrier medium and thermally-conducting medium to a value that is less than 90 percent of that of the transparent carrier medium. In other aspects of the invention, the concentration of the thermally-conducting medium is sufficient to reduce the net thermal resistance to less than 80 percent, 70 percent, 60 percent, or 50 percent of the thermal resistance of the transparent carrier medium.

If reflective particles are utilized, the density of particles must be less than the density at which the transmission of the phosphor layer is significantly reduced. If the particles are larger than, or on the order of the wavelength, the wavelength particles will reflect back a significant fraction of the light. As a result, the phosphor layer will appear to be a partially reflective surface.

The above-described embodiments utilize an arrangement in which a portion of the light generated by the LED remains unconverted and becomes part of the output light from the light device. However, light sources in which the light from the LED is completely converted to other wavelengths by one or more phosphors in the light-conversion layer can also be constructed. For example, the LED could generate light in the UV portion of the optical spectrum that is used to excite a plurality of different phosphors in the light-conversion layer to generate an output spectrum that is more uniform as a function of wavelength than that provided by the blue LED exciting a yellow-emitting phosphor. Such devices are better suited for lighting applications that require good color rendering for objects being illuminated by the light source.

The embodiments described above utilize a carrier material for the phosphor particles that is substantially transparent to the light generated by the LED and the light generated by the phosphor in response to being excited by the LED light. It will be recognized that all media have some absorption. For the purposes of the present discussion, a medium will be defined as being transparent to light of a given wavelength if that media absorbs less than 10 percent of that light, and preferably less than 5 percent of that light.

The phosphor-conversion structure of the present invention can be constructed in contact with the LED die in a manlier analogous to that shown in FIG. 1, or separated therefrom by a gap that is typically filled with a gas such as air in a manner analogous to that shown in FIG. 2. Embodiments that utilize a gap to isolate the phosphor-conversion structure from the die have the advantage of reducing the amount of heat that must be dissipated through the carrier material of the phosphor-conversion structure. However, embodiments in the configuration shown in FIG. 1 tend to be less expensive to construct. In either case, the phosphor-conversion structure of the present invention provides significant advantages over the prior art structures in terms of heat dissipation and reducing damage to the structure resulting from the heating of the phosphor particles by the light converted in the particles.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light-conversion composition comprising:
   a transparent carrier medium that is transparent to light at first and second wavelengths, said transparent carrier medium being characterized by carrier thermal resistance;
   a phosphor-conversion medium that converts light of said first wavelength to light of said second wavelength, said phosphor-conversion medium being dispersed in said transparent carrier medium; and
   a heat-conducting medium that has a thermal resistance that is less than said carrier thermal resistance, said heat-conducting medium being dispersed in said transparent carrier medium, and said heat-conducting medium comprising particles of a transparent crystalline material, wherein said light-conversion composition is characterized by a net thermal resistance and said heat-conducting medium is present in a concentration sufficient to yield a net thermal resistance that is less than 90 percent of said carrier thermal resistance.

2. The composition of claim 1 wherein said transparent carrier medium comprises epoxy or silicone.

3. The composition of claim 1 wherein said phosphor-conversion medium comprises particles of a phosphor that converts light of said first wavelength to light of said second wavelength.

4. The composition of claim 1 wherein said crystalline material comprises silicon, diamond, or sapphire.

5. The composition of claim 1 wherein said heat-conduction medium comprises particles of a metal.

6. A light-emitting device comprising:
a light-emitting element that emits light at a first wavelength;
a -conversion structure comprising
a transparent carrier medium that is transparent to light at said first wavelength and a second wavelength, said transparent carrier medium being characterized by carrier thermal resistance;
a phosphor-conversion medium that converts light of said first wavelength to light of said second wavelength, said phosphor-conversion medium being dispersed in said transparent carrier medium;
a heat-conducting medium that has a thermal resistance that is less than said carrier thermal resistance, said heat-conducting medium being dispersed in said transparent carrier medium, and said heat-conducting medium comprising particles of a transparent crystalline material, wherein said light-conversion structure is characterized by a net thermal resistance and said heat-conducting medium is present in a concentration sufficient to yield a net thermal resistance that is less than 90 percent of said carrier thermal resistance.

7. The device of claim 6 wherein said light-emitting element comprises an LED or a laser.

8. The device of claim 6 wherein said transparent carrier medium comprises epoxy or silicone.

9. The device of claim 6 wherein said phosphor-conversion medium comprises particles of a phosphor that converts light of said first wavelength to light of said second wavelength.

10. The device of claim 6 wherein said crystalline material comprises silicon, diamond, or sapphire.

11. The device of claim 6 wherein said heat-conduction medium comprises particles of a metal.

12. The device of claim 6 wherein said light-conversion structure is separated from said light-emitting element by a thermally-insulating medium.

13. The device of claim 12 wherein said thermally-insulating medium comprises air.

* * * * *

UNITED STATES PATENT AND TRADEMARK OFFICE
CERTIFICATE OF CORRECTION

PATENT NO. : 8,210,698 B2  
APPLICATION NO. : 12/845104  
DATED : July 3, 2012  
INVENTOR(S) : Heng Liu Page 1 of 1

It is certified that error appears in the above-identified patent and that said Letters Patent is hereby corrected as shown below:

Column 1 Line 35: Replace "coverts" by --converts--

Column 3 Line 52: Replace "20percent" by --20 percent--

Column 3 Line 54: Replace "10percent" by --10 percent--

Column 6 Line 23: Replace "manlier" by --manner--

Column 7 Line 14: Replace "-conversion" by --light-conversion--

Signed and Sealed this  
Eleventh Day of September, 2012

David J. Kappos  
*Director of the United States Patent and Trademark Office*